United States Patent
Gal et al.

(10) Patent No.: US 11,842,909 B2
(45) Date of Patent: Dec. 12, 2023

(54) PRESS, ACTUATOR SET AND METHOD FOR ENCAPSULATING ELECTRONIC COMPONENTS WITH AT LEAST TWO INDIVIDUAL CONTROLLABLE ACTUATORS

(71) Applicant: Besi Netherlands B.V., Duiven (NL)

(72) Inventors: Wilhelmus Gerardus Jozef Gal, Kilder (NL); Henricus Antonius Maria Fierkens, Lobith (NL)

(73) Assignee: Besi Netherlands B.V., Duiven (NL)

( * ) Notice: Subject to any disclaimer, the term of this patent is extended or adjusted under 35 U.S.C. 154(b) by 0 days.

(21) Appl. No.: 17/540,876

(22) Filed: Dec. 2, 2021

(65) Prior Publication Data

US 2022/0301901 A1 Sep. 22, 2022

Related U.S. Application Data

(62) Division of application No. 15/781,532, filed as application No. PCT/NL2016/050911 on Dec. 22, 2016, now Pat. No. 11,217,463.

(30) Foreign Application Priority Data

Dec. 23, 2015 (NL) ...................... 2016011

(51) Int. Cl.
*H01L 21/67* (2006.01)
*H01L 21/56* (2006.01)
(Continued)

(52) U.S. Cl.
CPC ........ *H01L 21/67126* (2013.01); *B29C 43/18* (2013.01); *B29C 45/7653* (2013.01);
(Continued)

(58) Field of Classification Search
CPC . H01L 21/67126; H01L 21/56; H01L 21/565; H01L 23/28; H01L 2924/181;
(Continued)

(56) References Cited

U.S. PATENT DOCUMENTS

| | | |
|---|---|---|
| 4,759,280 A | 7/1988 | Malashenko et al. |
| 5,817,347 A | 10/1998 | Tamcsin et al. |
| | (Continued) | |

FOREIGN PATENT DOCUMENTS

| | | |
|---|---|---|
| CN | 102099170 A | 6/2011 |
| CN | 104103530 A | 10/2014 |
| | (Continued) | |

OTHER PUBLICATIONS

English Translation of WO-2006100765-A1 retrieved Dec. 12, 2022 from Espacenet (Year: 2022).*

(Continued)

*Primary Examiner* — Francisco W Tschen
*Assistant Examiner* — Elisa H Vera
(74) *Attorney, Agent, or Firm* — THE WEBB LAW FIRM

(57) ABSTRACT

The invention relates to a press for encapsulating electronic components mounted on a carrier, comprising: at least two press parts displaceable relative to each other, a drive system for the displacement of the press parts, and an intelligent control adapted to control the drive system of the press parts wherein the drive system comprises at least two individual controllable actuators, the intelligent control further connects to plural displacement sensors for detecting the relative displacement of the press parts, and wherein the intelligent control is adapted to control the actuators of the drive system dynamically over time based on the measured values detected with the displacement sensors. The invention also relates to an actuator set to convert a prior art press into a (Continued)

press according to the present invention as well as to a method for encapsulating electronic components mounted on a carrier.

8 Claims, 7 Drawing Sheets

(51) Int. Cl.
*H01L 23/31* (2006.01)
*H01L 23/28* (2006.01)
*B29C 45/76* (2006.01)
*B29C 43/18* (2006.01)
*B29C 45/14* (2006.01)
*H01L 23/00* (2006.01)
*B29L 31/34* (2006.01)

(52) U.S. Cl.
CPC ............ *H01L 21/56* (2013.01); *H01L 21/565* (2013.01); *H01L 23/28* (2013.01); *H01L 23/31* (2013.01); *B29C 45/14655* (2013.01); *B29C 2043/181* (2013.01); *B29C 2945/76083* (2013.01); *B29C 2945/76254* (2013.01); *B29C 2945/76381* (2013.01); *B29C 2945/76391* (2013.01); *B29L 2031/3406* (2013.01); *H01L 24/97* (2013.01); *H01L 2924/181* (2013.01)

(58) Field of Classification Search
CPC ................. B29C 43/18; B29C 45/7653; B29C 2043/181; B29C 2945/76391; B29L 2031/3406
See application file for complete search history.

(56) References Cited

U.S. PATENT DOCUMENTS

| | | | |
|---|---|---|---|
| 6,134,507 A | 10/2000 | Markey, Jr. et al. | |
| 2006/0082010 A1* | 4/2006 | Saggese | B22D 17/007 264/40.5 |
| 2006/0160275 A1* | 7/2006 | Weggen | H01L 21/565 257/E21.504 |
| 2007/0176317 A1 | 8/2007 | Morita et al. | |
| 2007/0235897 A1 | 10/2007 | Brunnbauer et al. | |
| 2009/0093087 A1 | 4/2009 | Murakami et al. | |
| 2009/0200704 A1 | 8/2009 | Yamada et al. | |
| 2009/0220629 A1 | 9/2009 | Narasimalu et al. | |
| 2013/0161879 A1 | 6/2013 | Tagami et al. | |
| 2013/0207312 A1 | 8/2013 | Hench et al. | |
| 2013/0270730 A1* | 10/2013 | Kawachi | B29C 45/80 425/149 |
| 2015/0364456 A1 | 12/2015 | Yu et al. | |
| 2016/0082624 A1 | 3/2016 | Su et al. | |
| 2017/0248162 A1 | 8/2017 | Gruhler et al. | |

FOREIGN PATENT DOCUMENTS

| | | | |
|---|---|---|---|
| JP | 63102917 A | 5/1988 | |
| JP | S6457724 A | 3/1989 | |
| JP | H01272972 A | 10/1989 | |
| JP | H02239470 A | 9/1990 | |
| JP | H09076319 A | 3/1997 | |
| JP | H10012649 A | 1/1998 | |
| JP | H10268831 A | 10/1998 | |
| JP | H11207141 A | 8/1999 | |
| JP | 2006312280 A | 11/2006 | |
| JP | 2008114428 A | 5/2008 | |
| JP | 2008125681 A | 6/2008 | |
| JP | 2011037033 A | 2/2011 | |
| TW | I295617 B | 4/2008 | |
| TW | 201246404 A1 | 11/2012 | |
| TW | I503901 B | 10/2015 | |
| WO | WO-2006100765 A1 * | 9/2006 | ........... H01L 21/561 |

OTHER PUBLICATIONS

Adafruit, "Why Calibrate", Sep. 7, 2015, url: https://learn.adafruit.com/calibrating-sensors/why-calibrate, retrieved on Dec. 14, 2022 (Year: 2015).*

* cited by examiner

PRESS, ACTUATOR SET AND METHOD FOR ENCAPSULATING ELECTRONIC COMPONENTS WITH AT LEAST TWO INDIVIDUAL CONTROLLABLE ACTUATORS

CROSS-REFERENCE TO RELATED APPLICATIONS

This application is a divisional application of and claims priority to U.S. patent application Ser. No. 15/781,532, filed on Jun. 5, 2018, which is the United States national phase of International Application No. PCT/NL2016/050911, filed on Dec. 22, 2016, and claims priority to Dutch Patent Application No. 2016011, filed on Dec. 23, 2015, the disclosures of which are hereby incorporated by reference in their entireties.

BACKGROUND OF THE INVENTION

Field of the Invention

The invention relates to a press for encapsulating electronic components mounted on a carrier. The invention also relates to an actuator set for converting a press for encapsulating electronic components mounted on a carrier to a press of the present invention, as well as to a method for encapsulating electronic components mounted on a carrier.

Description of Related Art

The encapsulation of electronic components mounted on a carrier with an encapsulating material is a known art. On an industrial scale such electronic components are provided with an encapsulation, usually an encapsulation of a curing epoxy to which a filler material is added. There is a trend in the market toward simultaneous encapsulation of larger quantities of relatively small electronic components. Electronic components may be envisaged here such as semiconductors (chips, although LED's are in this respect also deemed semiconductors) which are generally becoming increasingly smaller. Once the encapsulating material has been arranged the collectively encapsulated electronic components are situated in an encapsulation (package) which is arranged on one side, but sometimes also on two sides, of the carrier. The encapsulating material often takes the form here of a flat layer connected to the carrier. The carrier may consist of a lead frame, a multi-layer carrier—manufactured partially from epoxy—(also referred to as board or substrate and so on) or another carrier structure like sensible silicon-, glass- or ceramic-carriers or wafers or any other carrier structure.

During the encapsulation of electronic components mounted on a carrier, use is usually made according to the prior art of encapsulating presses driving two mould parts with a moulding press, into at least one of the mould parts is recessed one or plural mould cavities. After placing the carrier with the electronic components for encapsulating between the mould parts, the mould parts may be moved toward each other by moving press parts to which the mould parts are connected, e.g. such that they clamp the carrier. A, normally heated, liquid encapsulating material may then be fed to the mould cavities, usually by means of transfer moulding. As an alternative it is also possible to bring the encapsulating material before closure of the mould parts, e.g. as a granulate, or sheet, or as liquid, in the mould cavity after which the components to be moulded are pressed into the encapsulating material; such compression encapsulating process is an alternative for transfer moulding. Applied as encapsulating material is epoxy (also referred to as resin) which is generally provided with filler material. After at least partial (chemical) curing of the encapsulating material in the mould cavity/cavities, the carrier with encapsulated electronic components is taken out of the encapsulating press. And subsequently the encapsulated products may be separated from each other during further processing. This method of encapsulation is practised on large industrial scale and enables well controlled encapsulation of electronic components. A problem during the encapsulating process and the subsequent processing of the moulded electronic components is that the control of the accuracy of the dimensions of the moulded product is not always enough to meet the increasing accuracy demands in the market furthermore there is a risk of damaging the carriers during the moulding process.

The present invention has for its object to provide an alternative method and device with which the advantages of the prior art method of encapsulating electronic components are maintained but that provide an enhanced process control leading to, among others, a better control of the dimensions of the encapsulated electronic components and/or a limit the risk of damaging the carriers. The invention is also capable of encapsulating exposed electronic components, by clamping the components before any encapsulating material is fed.

SUMMARY OF THE INVENTION

The invention provides for this purpose a press for encapsulating electronic components mounted on a carrier comprising at least two press parts displaceable relative to each other for supporting at least two co-operating mould parts, a drive system for driving the relative displacement of the press parts and an intelligent control connecting to the drive system of the press parts, said intelligent control being adapted to control the drive system of the press parts, wherein the drive system comprises as least two individual controllable actuators that enable to change the distribution of the pressure exerted by the drive system on at least one of the press parts in a position of the press parts wherein the press parts mutually exert pressure (thus after closure of the mould parts carried by the press parts). The intelligent control of the press of the present invention further connects to plural displacement sensors for detecting the relative displacement of the press parts at various locations, wherein the intelligent control is adapted to control the actuators of the drive system dynamically over time based on the measured values detected with the displacement sensors.

The press according the present invention enables to substantially maintain the relative orientation of the press parts, and thus also of the co-operating mould parts supported by the press parts, independent of the external loads and variations in the distribution of the loads exerted onto the press parts (or exerted onto the mould parts and transferred to the press parts). In the position of the press parts wherein the press parts mutually exert pressure, the mould parts are in a closed position.

An external pressure exerting influence may be the feed of (liquid) moulding material into a moulding cavity or moulding cavities of at least one of the mould parts. During the start of the feed of the moulding material only runners and subsequently also a part of the moulding cavity (moulding cavities) will be filled with liquid moulding material so only at those locations the moulding material will exert pressure onto the mould parts (that is transferred to the press parts).

This local and changing loads onto the press parts will lead to (limited; in the order of microns) local displacements of the mould parts (and thus also of the press parts carrying the mould parts) that—without further action—would lead to corresponding inaccuracies in the dimensions of the moulded product to be formed and to local enhanced pressure on the carriers. The present invention now enables the detection of any (limited) local displacements of the press parts and to correct/compensate these displacements by changing the distribution of the pressure exerted by the drive system on at least one of the press parts and so to level the press parts (and thus the mould parts attached to the press parts) to the original (desired) mutual position. Furthermore the clamping force on the carrier is more under control with the press according the invention as peak pressures on the carrier due to local displacements of the press parts (and thus the mould parts attached to the press parts) may be avoided, or at least limited. The advantage better control of the (maximum) pressure on the carrier is e.g. that for instance cracks in sensible silicon or glass (or other weak carriers or wafers) may be avoided. Also and enhanced control in the clamp force distribution provides a better control on the venting (to vent out the internal cavity gasses) as the planned dimensions of the venting apertures will better be maintained with the improved position control of the press parts (and thus the mould parts attached to the press parts). Furthermore a better control of the press part orientation (and thus of the mould parts attached to the press parts) is that there is less chance of leakage of moulding material in between the mould parts ("bleed" or "flash"). The present invention thus results in more control on the resulting dimensions of the moulded products, less chance of carrier damage and better process control (e.g. a proper venting function and avoidance of bleed/flash). It must be clear that not only during the feed of moulding material into at least one of the mould parts the external loads on the press parts may change. The same situation may arise during the curing process (or a part of the curing process) of the moulding material. The same compensation of local changing relative positioning of the press parts during (part of) the curing of the moulding material may be compensated by changing the distribution of the pressure exerted by the drive system on at least one of the press parts by the at least two individual controllable actuators.

In case the drive system of the press comprises at least three individual controllable actuators, e.g. one drive cylinder in combination with at least two press cylinders, the adjustability of a press part in two dimensions is possible, which further enhances the control on the dimensions of the electronic components to be moulded.

The individual controllable actuators may be formed by pressure cylinders, normally hydraulic pressure cylinders. But as an alternative one or more of the individual controllable actuators could be embodied as a spindle. These types of actuators are suited for the pressure demands in a moulding press, as long as the direction of the pressure exerted by the actuators corresponds to the direction of displacement of the actuators. As for the positioning of the individual controllable actuators; at least two of the pressure cylinders preferably contact the press part off-center to enable to change the orientation of the press part with the actuators. The actuators may act on the opposite press parts but regulatory and constructional it is most simple if at least three actuators, like pressure cylinders, co-act with a single press part. An alternative option is to use four or more cylinders co-acting with a single press part.

As the demands of geometric- and clamp force distribution-accuracy in the field of moulding electronic components are high the displacement sensors preferably are sensitive to relative displacements of microns (µm). Displacement sensors may provide such accuracy and can be combined with UOD (Unwanted Object Detection) to detect unwanted and/or unexpected materials, e.g. objects which should not be present at the place the objects are detected, during closure of the mould parts. An option for such sensors are—relative cheap—analog inductive proximity switches or analog capacitive proximity switches used as displacement sensors, and a more expensive alternative is the incorporation of incremental linear optical- or hall effect-sensors with high accuracy ruler systems.

The present invention not only relates to the press as such but also to the press wherein the press parts are supporting at least two mould parts, at least one of which mould parts being provided with at least one mould cavity recessed into a contact side for enclosing at least one electronic components placed on the carrier, the contact surface of this mould part at least partially enclosing the mould cavity for medium-tight connection onto the carrier in a closed position of the mould parts.

A mould part may also include a feed channel for moulding material recessed into the contact surface of the mould part provided with the mould cavity. Such a feed channel is also referred to as a "runner".

The press with mould parts may further also comprises feed means provided with at least one plunger for the purpose of exerting pressure on a liquid encapsulating material such that the encapsulating material is displaced to the mould cavity enclosing the electronic component. This type of presses are also referred to as "transfer moulding" presses. The press according the invention makes it possible reach a higher product specification with prior art mould parts and limited chance of damage of the carriers, and thus requires no adaptation/adjustment of standard mould parts. This limits the investments required for enhancing the production accuracy and process control.

The press with mould parts may further comprise releasing means to facilitate the release of the at least one mould part being provided with at least one mould cavity recessed into a contact side for enclosing at least one electronic component placed on the carrier. By use of such releasing means, the contact side is formed by the contact surface of the releasing means and the contact surface of the at least one mould part the releasing means cooperate with. By providing the releasing means, the release of the mould part provided with the mould cavity from an encapsulated assembly of electronic components mounted on a carrier is facilitated. Preferably the releasing means are configured to cooperate with the contact side of the mould part just beneath the position the runners are located. Even more preferred, the releasing means cooperate with the at least one mould part provided with the mould cavity such that the runners are formed by closing of the at least one mould part onto the releasing means. Alternatively, the runners may be incorporated into the releasing means, i.e. the at least one mould part the releasing means cooperate with is no longer provided with runners. The releasing means are configured such that the runners provided by the releasing means debouch into the mould cavity formed by closing the at least one mould part on the releasing means.

The press provided with releasing means facilitates the easy release of the mould part provided with runners, since the contact side of the mould part beneath the runners needs not to be removed together with the release of the mould part. Removal of the contact side beneath runners is considerably more difficult after performing the encapsulating method due to the cured moulding material which remains in the runners after the moulding process. By release the mould part provided with the mould cavity, e.g. the top mould part, first, the encapsulated electronic components may be release subsequently, before retracting the releasing means from the mould assembly.

Alternatively, the releasing means may be retracted from the mould assembly after release of the mould part the releasing means cooperate with. Preferably the releasing means are displaceable in a direction substantially perpendicular to the direction of the relative displacement of the press parts. In such embodiment, the material the releasing means are made of is chosen such that the part of the moulding material cured in the runners (and which moulding material partially connects to the surface of the releasing means) is retracted from the mould assembly by retraction of the releasing means.

Alternatively the releasing means may be displaceable in a direction which corresponds to the direction of the relative displacement of the press parts. By providing releasing means which are displaceable in the same direction as of the relative displacement of the press parts, the moulding material cured in the runners after moulding the electronic components may be removed by breaking.

The present invention also provides an actuator set for converting a press for encapsulating electronic components mounted on a carrier to a press according the present invention and as disclosed above, the actuator set comprises at least one actuator for driving the relative displacement of one of the press parts of the press, wherein the at least one actuator being adapted to be assembled with one of the press parts and to be connected to an intelligent control of the press. Such an actuator set enables the conversion of a prior art press with a single drive in an advanced press according the invention. Such a retrofit unit enables to convert standard presses with limited investment in the advanced system according the present invention. The actuator set also comprises displacement sensors for detecting the relative displacement of the press parts of the press at various locations, said displacement sensors being adapted to be assembled with the press parts of the press and to be connected to the intelligent control of the press. The actuator set may further comprise an intelligent control program required to control the processing information of the displacement sensors.

The present invention also provides a method for encapsulating electronic components mounted on a carrier with encapsulating material, comprising the processing steps of: A) placing an electronic component for encapsulating on a mould part, B) relatively displacing a least two mould parts towards each other with a closing force such that the electronic components for encapsulating are enclosed by at least one mould cavity and the carrier is clamped between the mould parts, C) exerting pressure on a liquid encapsulating material with at least one plunger such that encapsulating material is displaced to the at least one mould cavity enclosing the electronic components, D) filling the mould cavity with encapsulating material, and E) at least partially curing the encapsulating material in the mould cavity, wherein the distribution of the pressure exerted on at least one of the mould parts during at least processing step D) is varied dependent on measured local displacements of the mould parts.

With regard to the relative displacement of the at least two mould parts, it is noted that the term "relative displacement" encompasses at least the displacement of both mould parts towards each other as well as the displacement of one of the mould parts towards the other mould part.

The distribution of the pressure exerted on at least one of the mould parts during at least processing steps D) and E) may be varied dependent on measured local displacements of the mould parts. With this method an active pressure distribution over one (or even both) mould parts is realised during at least a part of the transfer trajectory. The transfer of the moulding material will realise a variation in the loads exerted on the mould parts as well as a variation in the distribution of the loads exerted onto the mould part with the effect of (limited) changes in the local relative positioning of the mould part. These (limited) changes in the local relative positioning of the mould part will on their turn result in (limited) inaccuracies in the dimensions of the moulded product, an enhanced process control, as well as in a limited chance of carriers damage during the moulding process. For further advantages of the method according the present invention reference is made to the advantages as above mentioned in relation to the press according the present invention and which are incorporated here by reference in relation to the method according the invention too.

The distribution of the pressure exerted on at least one of the mould parts may be varied by individually controlling at least two, but preferably at least three, independent controllable actuators cooperating with at least one of the mould parts. The plural controls enable to change the orientation of the mould part and full control of the orientation settlement requires at least three controls. For control of the orientation of a mould part the distribution of the pressure exerted on at least one of the mould parts may be at least partially controlled by feedback of the measured local displacements of the mould parts. Additionally the distribution of the pressure exerted on at least one of the mould parts may at least partially be controlled by feed forward of at least one detected process variable. In case e.g. filling pressure and filling progression are running along known paths the variations of the exerted pressure and pressure distribution there is a fair estimate to be made on the changes in the relative orientation of the mould parts in a passive situation wherein the expected changes are not compensated. Based on these estimates in the behavior a feed forward steering can anticipate on the relative orientation changed to be expected. For such feed forward steering the distribution of the pressure exerted on at least one of the mould parts may at least partially controlled by stored historical process information. Such a steering (controlling) may also continuously adapt so that the control becomes a "self-learning" control system.

Further, the method for encapsulation according to present invention may further comprising the step of displacing releasing means in a direction substantially perpendicular (or alternatively in a direction which corresponds) to the direction of the relative displacement of the at least two mould parts before clamping the carrier between the mould parts in step B), such that the releasing means form part of the contact side of the at least one mould part provided with the at least one mould cavity to clamp the carrier between the releasing means and the mould parts. It is noted that by using the releasing means the releasing means reduces the effective clamp force of the mould part the releasing means cooperate with. Therefore, the method of the present invention may further comprise a calibration step, before clamping the carrier between the releasing means and the mould parts. Such calibration step comprises the relatively displacement of the at least two mould parts towards each other with a closing force such that the electronic components for encapsulating are enclosed by at least one mould cavity and the carrier is clamped between the mould parts. By inclusion of such calibration step a baseline pressure may be measured without using the releasing means. The baseline measurement of the clamping force is performed by relatively displacing the at least two mould parts towards each other. The clamping force measured during use of the releasing means is compared with the clamping force measured during the baseline measurement. The actual clamping force exerted on the carrier is corrected by independently controlling the actuators.

BRIEF DESCRIPTION OF THE DRAWINGS

The present invention will be further elucidated on the basis of the non-limitative exemplary embodiments shown in the following figures. Herein shows.

DESCRIPTION OF THE INVENTION

Figure 1:
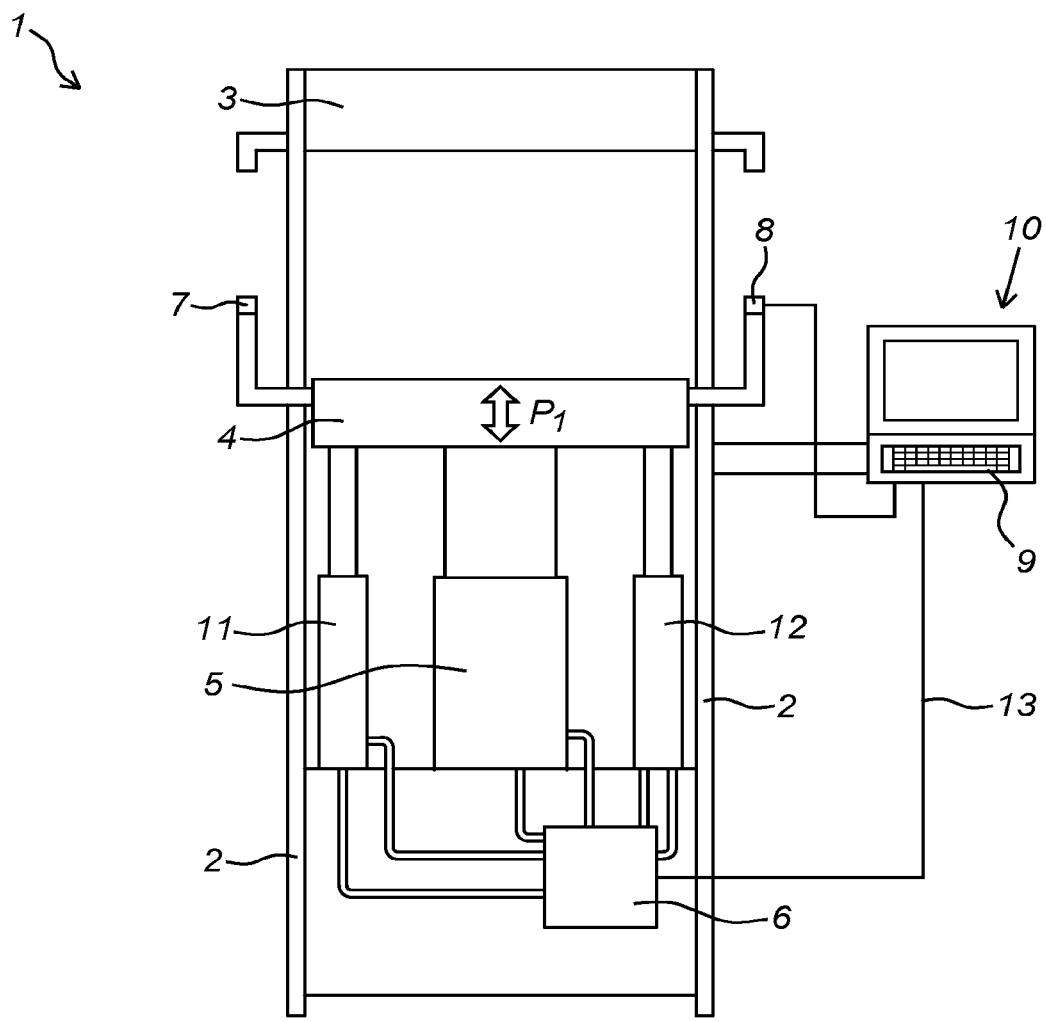
FIG. 1 a schematic view on a press for encapsulating electronic components according the present invention.

FIG. 1 shows a press 1 for encapsulating electronic components with a frame 2 holding two press parts 3, 4 displaceable relative to each other according arrow $P_1$. The press 1 comprises a main drive cylinder 5, i.e. the first actuator, which is controlled by a fluid pump system 6. The press parts 3, 4 are suited for carrying two co-operating mould parts (not shown in this figure). The press also includes two displacement sensors 7, 8 for detecting the relative displacement of the press parts 3, 4 at various locations location of the press parts 3, 4 (here at the left and right sight of the press parts 3, 4). The displacement sensors 7, 8 are connected to an intelligent control 9 which may be part of an operator console 10. The information provided by the displacement sensors 7, 8 is processed by the intelligent control 9 and may result in a steering of the fluid pump system 6. In the present invention there are two additional individual controllable press cylinders 11, 12, i.e. the second and third actuator, which are also fed (steered) by the fluid pump system 6 via control line 13 but so that their displacement is individually controlled (so independent of the main drive cylinder 5 and independent from each other). This provides the opportunity to influence the distribution of the pressure (load) exerted onto lower press part 4 and thus of the orientation of the lower press part 4.

Figure 2A:
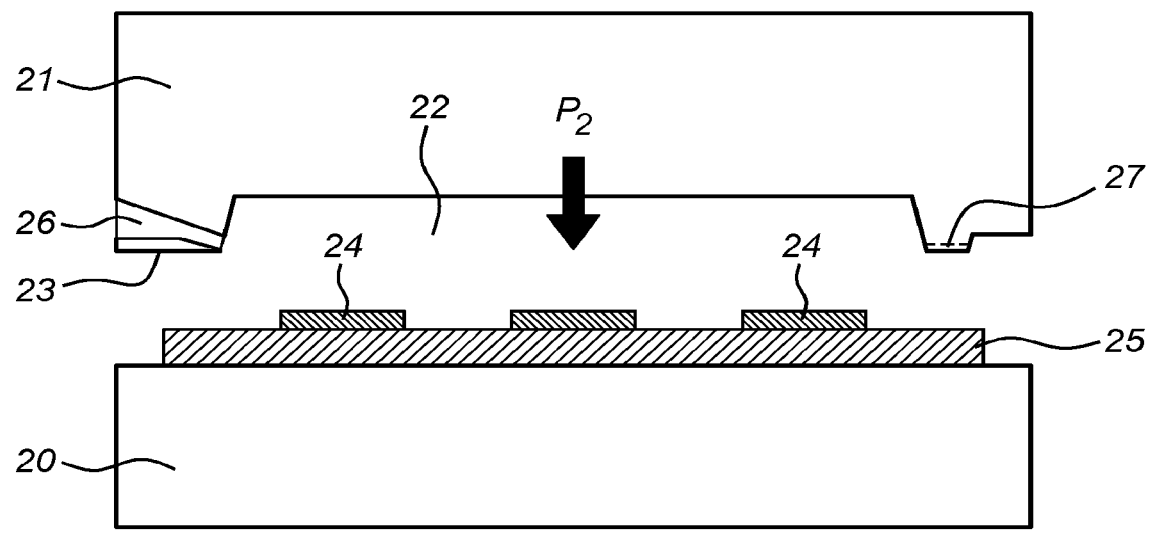
FIG. 2A a schematic side view on a pair of mould parts and a carrier with electronic components in a situation before encapsulation wherein the mould parts are opened.

FIG. 2A shows a schematic side view on a pair of mould parts 20, 21. The top mould part 21 is provided with a moulding cavity 22 that is recessed into a contact side 23 of the mould part 21 for enclosing at least electronic components 24 placed on a carrier 25. In the top mould part 21 is also recessed a feed channel 26 for feeding moulding material (not visible in this figure) to the moulding cavity 22. The moulding cavity 22 is surrounded by the contact side 23 that is designed for connecting onto the carrier 25 and in this contact side 23 a venting opening 27 is provided to allow gasses to leave the moulding cavity 22 during the moulding process. According arrow $P_2$ the mould parts 20, 21 are closed onto each other as is shown in FIG. 2B.

Figure 2B:
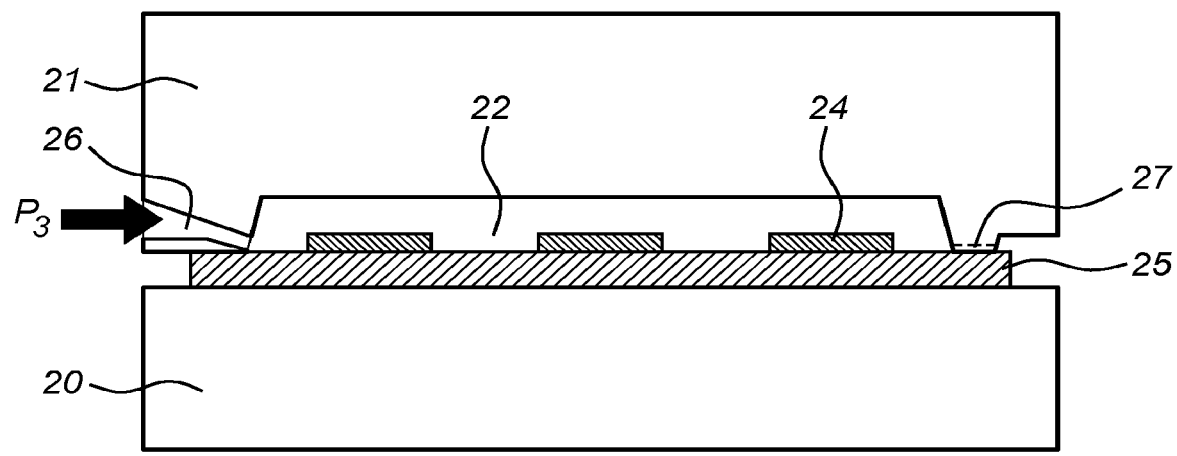
FIG. 2B a side view on the mould parts and the carrier with electronic components as shown in FIG. 2A in a situation before encapsulation wherein the mould parts are closed.

In FIG. 2B mould closure is executed by the top mould part 21 contacting the carrier 25 on bottom mould part 20 but still before the moulding material is fed into the moulding cavity 22. The venting opening 27 leaves a small gas outlet free between the carrier 25 and the mould part 21. As the mould parts 20, 21 are closed now with restricted clamp force from the press carrying the mould parts 20, 21 to avoid damage on carrier 25, the situation is prepared to fill the moulding cavity 22 via runner 26 with moulding material according $P_3$.

Figure 2C:
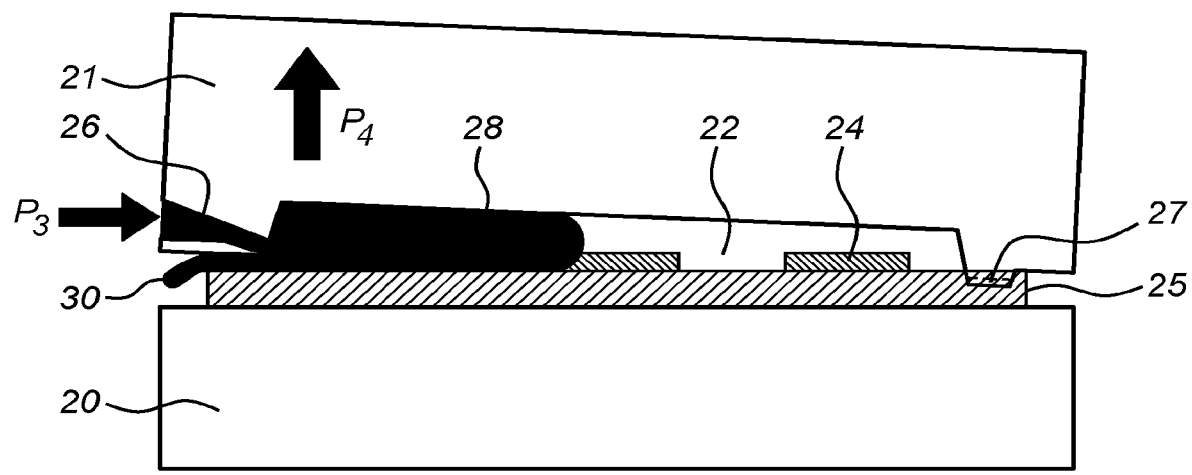
FIG. 2C a side view on the mould parts and the carrier with electronic components as shown in FIGS. 2A and 2B in a situation during encapsulation with closed mould parts according the prior art.

In FIG. 2C moulding material 28 is fed into the mould cavity 22 according the prior art. The effect that may occur (which is exaggerated in this FIG. 2C) is that the moulding material 28 locally (here on the left side) exerts a pressure (see arrow $P_4$) onto the top mould part 21, which local pressure ($P_4$) makes the top mould part 21 to tilt (displacement relative to the lower mould part 20). The drawbacks of such relative displacement of the mould parts 20, 21 are among others that the resulting moulded electronic component has an undesired shape (here a sloping remaining housing "package" of the moulding material 28) as well as that moulding material 28 may leak between the contact side 23 of the mould part 21 and the carrier (see leakage/bleed/flash 30). A further draw back of the situation as depicted in FIG. 2C is that the top mould part 21 locally (see right sight of the drawing) is pressed into the carrier 25 which could damage the carrier 25 and which also may influence the gas discharge capacity of the venting opening 27 (or even leads to a complete blocking of the gas discharge).

Figure 2D:
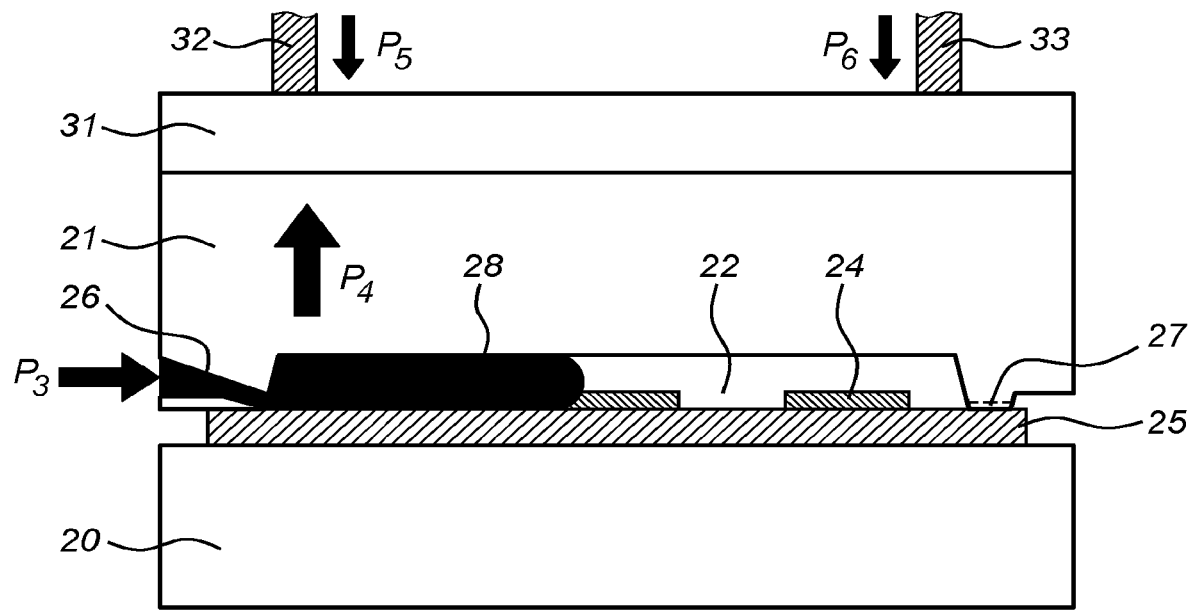
FIG. 2D a side view on the mould parts and the carrier with electronic components as shown in FIGS. 2A and 2B in a situation during encapsulation with closed mould parts according the present invention.

In FIG. 2D moulding material 28 is also fed into the mould cavity 22 but now in a situation according the present invention. The top mould part 21 is attached to a press part 31 driven by two individual controllable actuators 32, 33 (here spindle actuators as an alternative for the cylinder actuators as shown in FIG. 1). To compensate the pressure exerted by the moulding material 28 (see arrow $P_4$) the pressure exerted by the left actuator 32 (see arrow $P_5$) is larger than the pressure exerted by the right actuator 33 (see arrow $P_6$). The different pressure distribution according the present invention during the feed of the moulding material 28 by the actuators 32, 33 prevents various disadvantages as shown in FIG. 2C, the dimensions of the moulded electronic components 24 are better controlled, there is less chance of damaging the carrier 25 and the venting 27 will function properly.

Figure 2E:
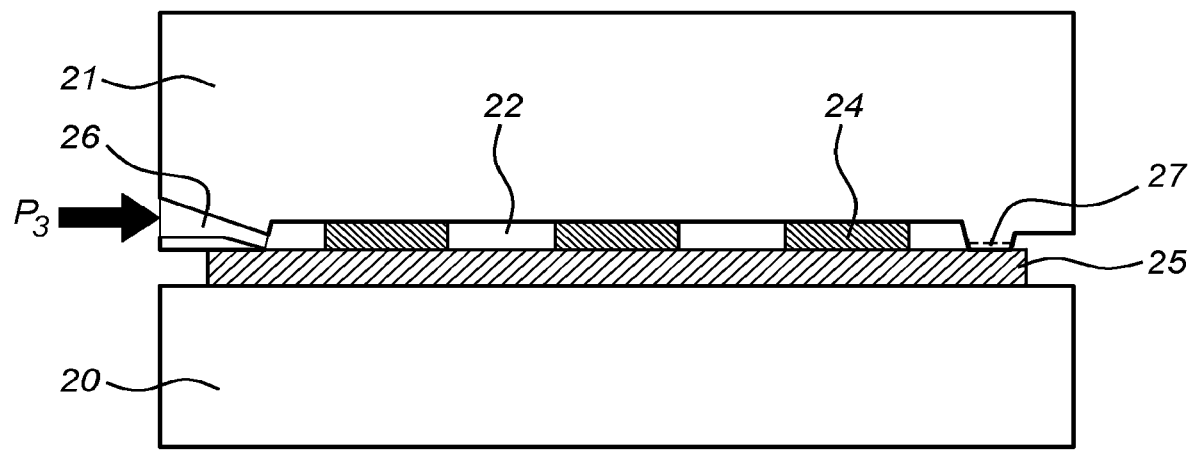
FIG. 2E a side view on mould parts and the carrier with electronic components with different dimensions as the situation shown in FIG. 2B, also here in a situation before encapsulation wherein the mould parts are closed.

FIG. 2E shows the mould parts 20, 21 clamping a carrier 25 with electronic components 24, which electronic components 24 are just touching with high accuracy the inside of the mould cavity 22 of the top mould 21. In the depicted situation the mould parts 20, 21 are closed with a restricted clamp force to avoid damage of the carrier 25 and the electronic components 24.

Figure 2F:
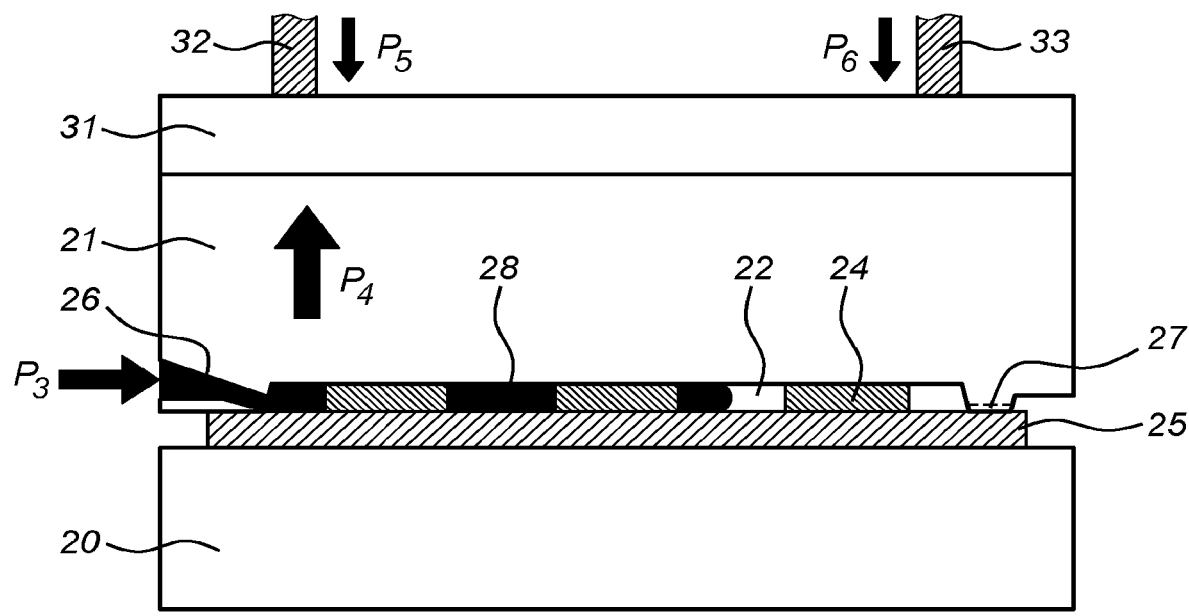
FIG. 2F a side view on the mould parts and the carrier with electronic components as shown in FIG. 2E in a situation during encapsulation with closed mould parts according the present invention.

In FIG. 2F moulding material 28 is fed into the mould cavity 22 holding the electronic components as shown in FIG. 2E according the present invention. The top side of the electronic components 24 is kept free of moulding material 28 such that "exposed" electronic components 24 remain after the moulding process. The top mould part 21 is attached to the press part 31 as is shown in FIG. 2D and is driven by the two individual controllable actuators 32, 33 as already explained in relation to FIG. 2D. Also here the pressure exerted by the moulding material 28 (see arrow $P_4$) is compensated by the pressure exerted by the left actuator 32 (see arrow $P_5$) that is larger than the pressure exerted by the right actuator 33 (see arrow $P_6$). The dimensions and the exposed surfaces of the moulded electronic components 24 are well controlled, there is limited chance of damaging the carrier 25 or the electronic components 24 and the venting 27 will function properly.

Figure 3:
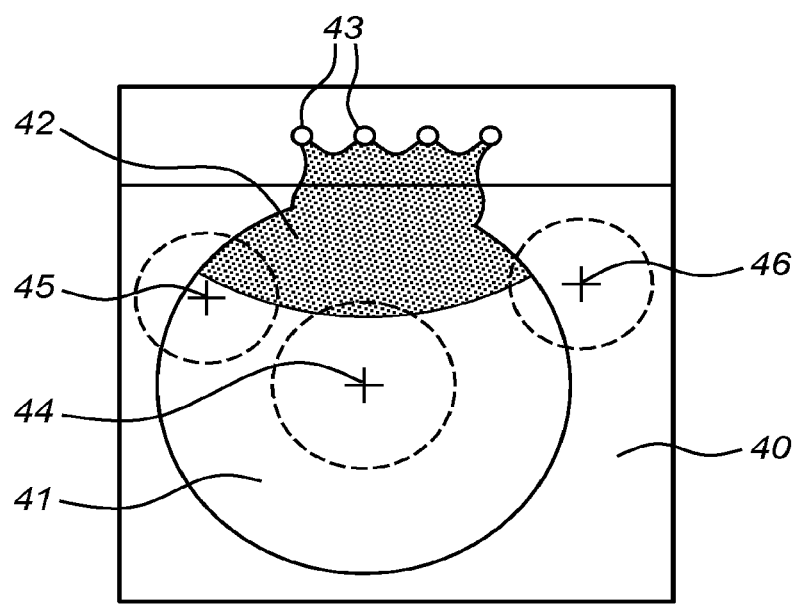
FIG. 3 a top view on a mould part with a moulding cavity partially filled with moulding material.

FIG. 3 shows a top view on a mould part 40 with a moulding cavity 41 partially filled with moulding material 42. The (liquid) moulding material 42 is fed by plungers 43 to the moulding cavity 41. The moulding cavity 41 here shown is circular, e.g. for moulding a wafer type carrier. Also dotted indicated are the locations where three individual controllable actuators 44, 45, 46 are located on the opposite side of the mould part 40 where the moulding cavity 41 is located. The positions of the individual controllable actuators 44, 45, 46 enable to control the full orientation of the mould part 40 as three actuators 44, 45, 46 enable full levelling of a surface (the mould part 40) in the second dimension (lengthwise and crosswise on the flow direction of the moulding material 42).

Figure 4A:
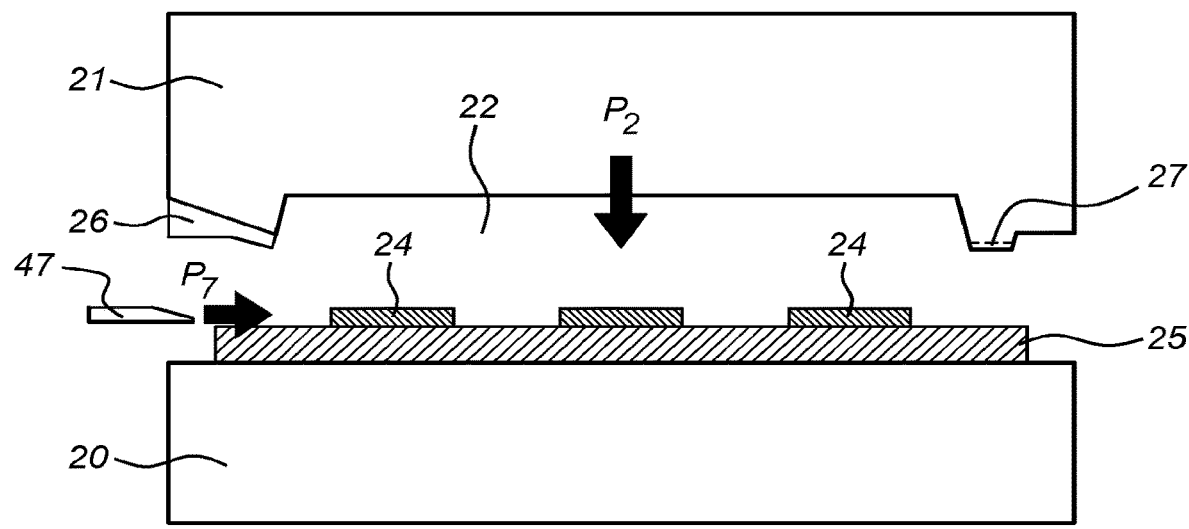
FIG. 4A a schematic side view on a pair of mould parts and a carrier with electronic components in a situation before encapsulation wherein the mould parts are opened.
Figure 4B:
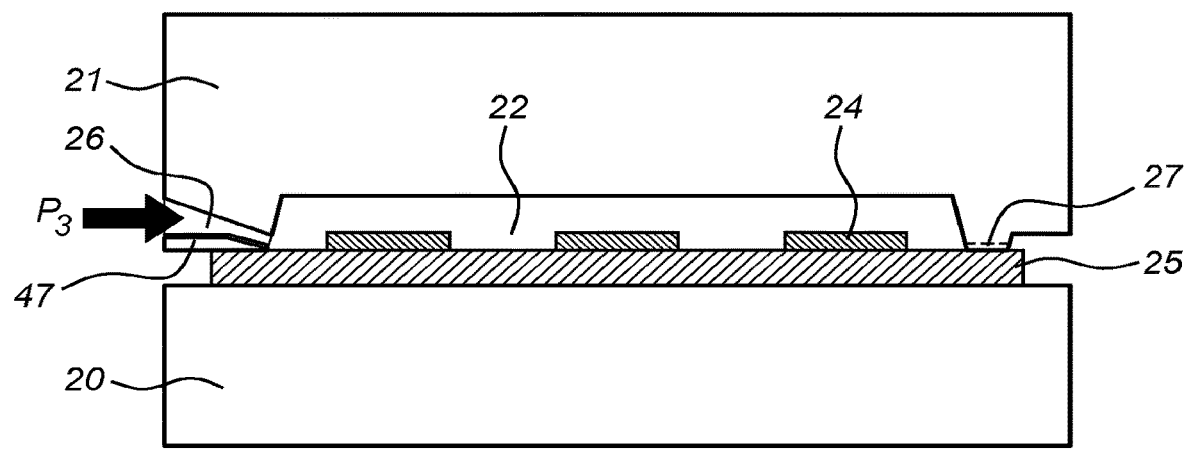
FIG. 4B a side view on the mould parts and the carrier with electronic components as shown in FIG. 4A in a situation before encapsulation wherein the mould parts are closed.
Figure 5A:
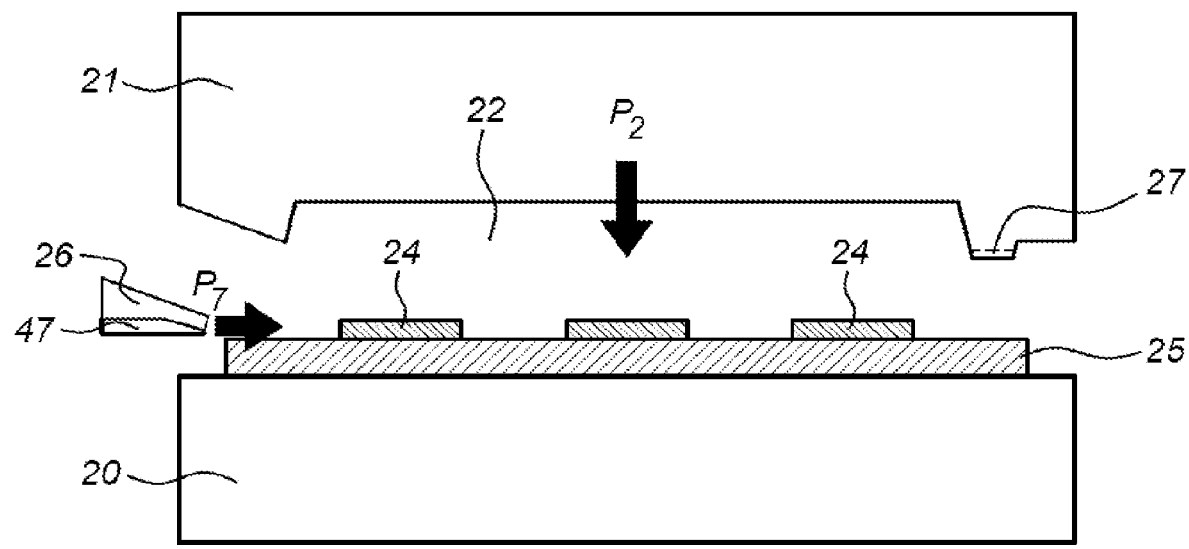
FIG. 5A a schematic side view on a pair of mould parts and a carrier with electronic components in a situation before encapsulation wherein the mould parts are opened.
Figure 5B:
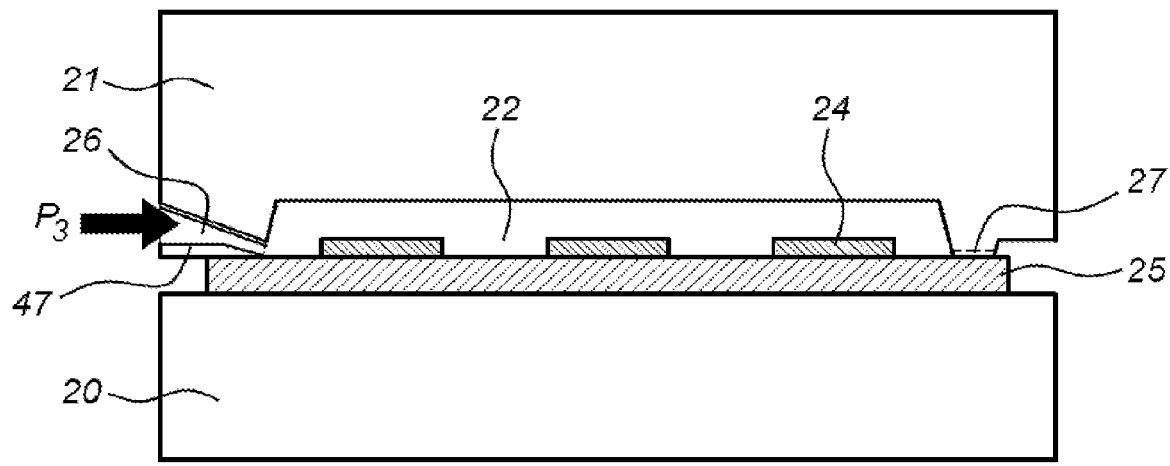
FIG. 5B a side view on the mould parts and the carrier with electronic components as shown in FIG. 5A in a situation before encapsulation wherein the mould parts are closed.

FIG. 4A and FIG. 4B show a further embodiment of the present invention. FIG. 4A shows a schematic side view on a pair of mould parts 20, 21. The top mould part 21 is provided with a moulding cavity 22 for enclosing at least electronic components 24 placed on a carrier 25. In the top mould part 21 is also recessed a feed channel 26 for feeding moulding material (not visible in this figure) to the moulding cavity 22. Different to the embodiment shown in FIG. 2A, the moulding device of FIG. 4A further comprises top mould part 21 releasing means 47, for facilitating the release of the top mould part 21 from the encapsulated electronic components 24. The releasing means 47 are displaceable according to arrow $P_7$. The releasing means 47 can be displaced independently from the displacement of the mould parts 20, 21. Similar to the embodiment disclosed in FIG. 2A, the mould parts 20, 21 are closed onto each other according arrow $P_2$. Ultimately by closure of the mould parts 20, 21, but preferably before closure of the mould parts 20, 21, releasing means 47 are placed in line with the mould parts 20, 21, to form the closed mould part assembly of FIG. 4B.

In FIG. 4B the moulding cavity 22 is surrounded by the contact side 23 as shown in FIG. 2B of which releasing means 47 form part of and wherein the contact side 23 is designed for connecting onto the carrier 25 and in this contact side 23 a venting opening 27 is provided to allow gasses to leave the moulding cavity 22 during the moulding process. Further, the mould closure is executed by the top mould part 21 contacting the carrier 25 and the releasing means 47 on bottom mould part 20 but still before the moulding material is fed into the moulding cavity 22. The venting opening 27 leaves a small gas outlet free between the carrier 25 and the mould part 21. As the mould parts 20, 21 are closed now with restricted clamp force from the press carrying the mould parts 20, 21 to avoid damage on carrier 25, the situation is prepared to fill the moulding cavity 22 via runner 26 with moulding material according $P_3$.

After filling the mould cavity 22 with moulding material, the top mould part 21 can be released easily. By providing the releasing means 47 in the part of the contact side 23 the runner 26 is provided, the top mould part 21 can be released without the need of releasing the complete surrounding contact side 23 from the carrier 25 on the bottom mould part 20. After the top mould part 21 is removed, the releasing means 47 are retracted from the closure position (the position as shown in FIG. 4B) to allow the further release of the encapsulated electronic components 24. Preferably, the releasing means 47 are retracted in a direction opposite to the direction indicated by arrow $P_7$ as shown in FIG. 4A. Preferably, the material used for the releasing means 47 is chosen such that the part of moulding material 28 cured in the runner 26 is retracted from the mould part device by retraction of the releasing means 47.

Similar to the embodiments shown in FIGS. 4A and 4B, FIGS. 5A and 5B show an embodiment comprising the releasing means 47, wherein the runner 26 is provided in the releasing means 47. By closing the mould parts 20, 21 the mould cavity 22 formed connects to the runner 26 of the releasing means 47.

The invention claimed is:

1. A method for encapsulating electronic components mounted on a carrier with encapsulating material, comprising the processing steps of:
   A) placing an electronic component for encapsulating on a mould part,
   B) relatively displacing at least two mould parts towards each other with a closing force such that the electronic components for encapsulating are enclosed by at least one mould cavity and the carrier is clamped between the mould parts,
   C) exerting pressure on a liquid encapsulating material with at least one plunger such that encapsulating material is displaced to the at least one mould cavity enclosing the electronic components,
   D) filling the mould cavity with encapsulating material,
   E) at least partially curing the encapsulating material in the mould cavity, wherein the distribution of the pressure exerted on at least one of the mould parts during at least processing step D) is varied dependent on measured local displacements of the mould parts, and
   F) displacing a releasing means in a direction substantially perpendicularly to the direction of relative displacement of the at least two mould parts to facilitate the release of at least one of the at least one mould part, wherein the releasing means is independently displaced from between the at least two mould parts.

2. The method for encapsulating according to claim 1, wherein the distribution of the pressure exerted on at least one of the mould parts during at least processing steps D) and E) is varied dependent on measured local displacements of the mould parts.

3. The method for encapsulating according to claim 1, wherein the distribution of the pressure exerted on at least one of the mould parts is varied by individually controlling at least two independent controllable actuators cooperating with at least one of the mould parts.

4. The method for encapsulating according to claim 1, wherein the distribution of the pressure exerted on at least one of the mould parts is at least partially controlled by feedback of the measured local displacements of the mould parts.

5. The method for encapsulating according claim 1, wherein the distribution of the pressure exerted on at least one of the mould parts is at least partially controlled by feed forward of at least one detected process variable.

6. The method for encapsulating according to claim 1, wherein the distribution of the pressure exerted on at least one of the mould parts is at least partially controlled by stored historical process information.

7. The method for encapsulation according to claim 1, wherein before clamping the carrier between the mould parts in step B), the method further comprising the step of displacing the releasing means in a direction substantially perpendicular to the direction of the relative displacement of the at least two mould parts such that the releasing means form part of the contact side of the at least one mould part provided with the at least one mould cavity to clamp the carrier between the releasing means and the mould parts.

8. The method for encapsulation according to claim 7, wherein, before clamping the carrier between the releasing means and the mould parts, the method further comprising a calibration step, including relatively displacing the at least two mould parts towards each other with a closing force such that the electronic components for encapsulating are enclosed by at least one mould cavity and the carrier is clamped between the mould parts.

\* \* \* \* \*